United States Patent
Tomizawa

[11] Patent Number: 5,917,245
[45] Date of Patent: Jun. 29, 1999

[54] SEMICONDUCTOR DEVICE WITH BRAZING MOUNT

[75] Inventor: Hisao Tomizawa, Niiza, Japan

[73] Assignees: Mitsubishi Electric Corp., Tokyo; Sanken Electric Co. Ltd., Saitama-Pref., both of Japan; a part interest

[21] Appl. No.: 08/777,944

[22] Filed: Dec. 23, 1996

[30] Foreign Application Priority Data

Dec. 26, 1995 [JP] Japan ................................ 7-354741

[51] Int. Cl.$^6$ ............................................ H01L 23/48
[52] U.S. Cl. ........................ 257/783; 257/99; 257/731
[58] Field of Search ........................... 257/783, 99, 81, 257/782, 731

[56] References Cited

U.S. PATENT DOCUMENTS

| | | |
|---|---|---|
| 3,434,018 | 3/1969 | Boczar et al. . |
| 3,740,617 | 6/1973 | Teramoto et al. . |
| 3,813,587 | 5/1974 | Umeda et al. ............................. 257/99 |
| 4,862,247 | 8/1989 | Dayberry et al. . |
| 5,298,768 | 3/1994 | Okazaki et al. ........................... 257/99 |
| 5,310,701 | 5/1994 | Kaussen et al. . |
| 5,410,451 | 4/1995 | Hawthorne et al. . |

FOREIGN PATENT DOCUMENTS

| | | |
|---|---|---|
| 0528606 | 2/1993 | European Pat. Off. . |
| 7086470 | 3/1995 | Japan . |

OTHER PUBLICATIONS

Patent Abstracts of Japan vol. 096, No. 002, Feb. 29, 1996 & JP 07273258 A (Mitsubishi Electric Corp), Oct. 20 1995.
Patent Abstracts of Japan vol. 012, No. 177, (E–613), May 25, 1988 & JP 62 283648 A (Matsushita Electronic Corp), Sep. 9, 1987.
Patent Abstracts of Japan vol. 011, No. 271 (E–536), Sep. 3, 1987 & JP 62 072147A (Toshiba Corp), Apr. 2, 1987.
Patent Abstracts of Japan, vol. 008, No. 059 (E–232), Mar. 17, 1984 & JP 58 210643 A (Mitsubishi Denki KK), Dec. 7, 1993.

*Primary Examiner*—Peter Toby Brown
*Assistant Examiner*—Roy Potter
*Attorney, Agent, or Firm*—Bachman & LaPointe, P.C.

[57] ABSTRACT

A mount 2 is secured on a circuit board 1 to support a diode chip 3 thereon. A plurality of legs 7, 12 formed in the mount 2 are in contact with an electrode 4 on the circuit board 1 to form at least a dent 14. The mount 2 also has an inclined surface 8 formed at the periphery which faces the electrode 4. Solder 9 is filled in the dent 14 between the legs 7, 12 and in the flaring area 13 between the circuit board 1 and the inclined surface 8 of the mount 2 to prevent exfoliation or detachment of the mount from the electrode 4.

5 Claims, 3 Drawing Sheets

SEMICONDUCTOR DEVICE WITH BRAZING MOUNT

BACKGROUND OF THE INVENTION a). Field of the Invention

This invention relates to a semiconductor device, in particular of type having a mount which is certainly secured on a circuit board to support a semiconductor element on the mount.

b). Description of the prior art

A known semiconductor device includes a circuit board on which a mount made of copper is secured to support a semiconductor element thereon. The mount is effective to outwardly radiate heat produced by the semiconductor element upon operation for increase of electric current capacity.

However, the mount tends to be attached on the circuit board in the slant condition because of irregular amount of brazing metal between a flat surface of the mount and the circuit board. In addition, it is very difficult to secure the mount on the circuit board in an exactly upright condition with uniform thickness of the brazing metal all over the flat surface of the mount. Moreover, it is also actually impossible to braze a plurality of mounts on the circuit board with a constant thickness of brazing metal for a same level although the mounts are correctly secured on the circuit board in the upright condition.

In case the mount is secured on the circuit board in the inclined condition, a semiconductor element cannot correctly be attached on the mount by die bonding, and ends of thin wires cannot be connected on electrodes of the semiconductor element, thereby resulting in failure of connection or disconnection of the thin wires. Also, uneven or insufficient thickness of the brazing metal causes incorrect electric properties or deterioration of the semiconductor device in an environment test such as severe thermal test or thermal fatigue test, and sometimes the slant attachment of the mount would give rise to some troubles in the manufacturing process of the semiconductor device.

An object of the present invention is to provide a semiconductor device capable of avoiding slant attachment of a mount on a circuit board.

Another object of the invention is to provide a semiconductor device which has a mount certainly secured on a circuit board correctly in the upright condition.

SUMMARY OF THE INVENTION

The semiconductor device according to the present invention includes a support, a mount secured on the support by brazing metal and a semiconductor element secured on the mount. The mount is formed with at least an inclined surface formed at the periphery which faces the support and a plurality of legs formed inside the inclined surface to form at least a dent between the legs. The inclined surface is divergent away from the support, and the legs are in contact with the support. The brazing metal is disposed in a gap including the dent and a flaring area between the support and the inclined surface of the mount between the support and mount.

In an embodiment of the present invention, the mount is formed into substantially rectangular shape to form four inclined surfaces, and the legs forms a cross dent inwardly extending from each inclined surface. The legs are formed into columns or elongated protrusions separated from each other, extending from the mount. The support includes a circuit board on which at least an electrode and circuit conductor are formed thereon for electrical connection.

The method for manufacturing a semiconductor device according to the present invention comprises the steps of: providing a mount formed with a plurality of integrally formed legs and at least an inclined surface formed at the periphery; piling in turn on an electrode formed on a support, an adhesive solder paste, the mount, an adhesive solder past and a semiconductor chip to form a subassembly; and heating the subassembly to re-fuse the solder pastes and then cooling same for full setting to simultaneously bond the mount and semiconductor chip on the support. Gas produced in brazing metal is released during the heating process through at least a dent formed between the legs and the inclined surface out of the brazing metal, thus preventing trapping of bubbles therein.

The legs formed in the mount are effective to prevent slant attachment of the mount on the support with substantially uniform thickness of brazing metal between the support and mount. In addition, the mount is firmly bonded on the support by brazing metal filled in the dent between the legs and in the flaring area between the support and the inclined surface of the mount to prevent exfoliation or detachment of the mount from the support when the semiconductor device is used under severe variation of ambient temperature. As a result, the semiconductor device can keep good electric properties during its long duration and improve yield in manufacture. A plurality of legs separated from each other provide stable attachment of the mount against its inclined condition because gas produced in brazing metal is released through the dent out of the brazing metal, thus preventing trapping of bubbles therein and enhancement of braze strength.

The above-mentioned as well as other objects of the present invention will become apparent during the course of the following detailed description and appended claims.

DETAILED DESCRIPTION OF THE PREFERRED EMBODIMENT

Figure 1:
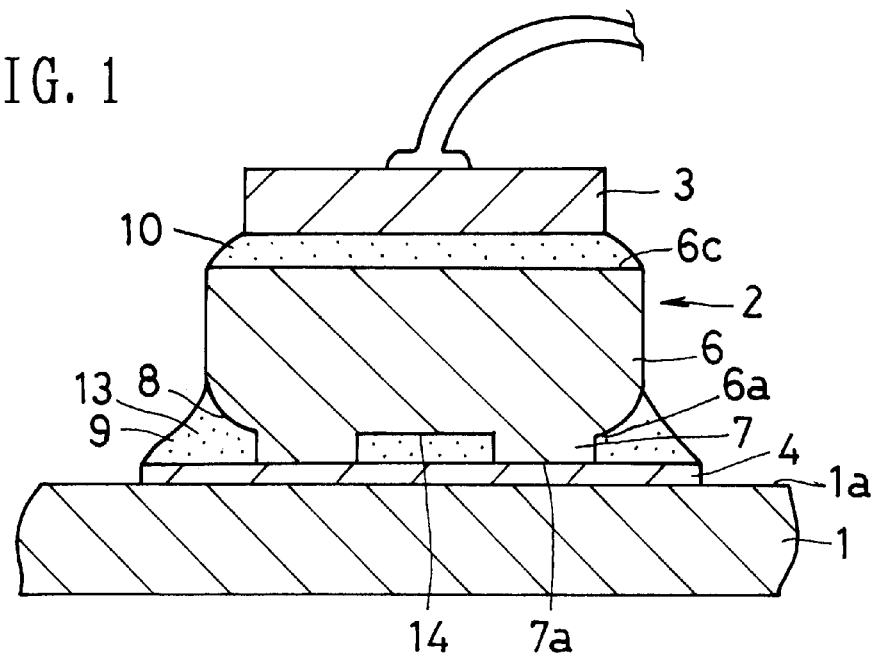
FIG. 1 is a partial section view of an embodiment of the semiconductor device according to the present invention.

FIGS. 1 to 4 indicate a first embodiment of the semiconductor device according to the present invention. As shown in FIG. 1, the semiconductor device comprises a circuit board 1 to form a support of ceramics such as alumina ($Al_2O_3$), a mount 2 secured on the circuit board 1, and a diode chip 3 of silicon (Si) as a semiconductor element. Not shown but, the mount 2 comprises a base of copper and a metallic coating formed on the base. The metallic coating consists of a first nickel (Ni) plating layer formed on the base and a second silver (Ag) plating layer formed on the first layer.

Figure 2:
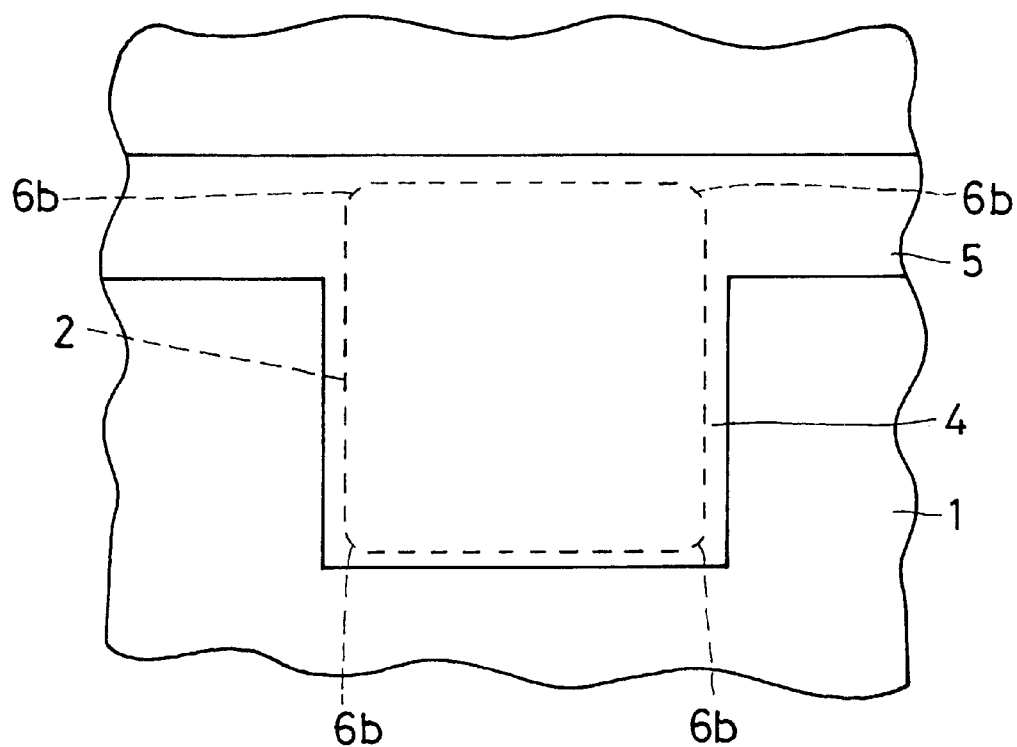
FIG. 2 is a partial plan view of the semiconductor device.

As shown in FIGS. 1 and 2, an electrode (pad) 4 and a circuit conductor 5 connected with the electrode 4 are mounted on a main surface 1a of the circuit board 1. The electrode 4 has a substantially rectangular shape similar to the shape of the mount 2 to preferably bond the mount 2 on the electrode 4.

Figure 3:
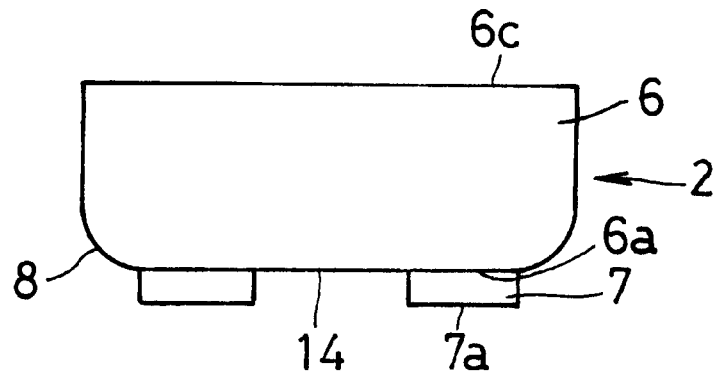
FIG. 3 is a side view of a mount used in the semiconductor device shown in FIG. 1.
Figure 4:
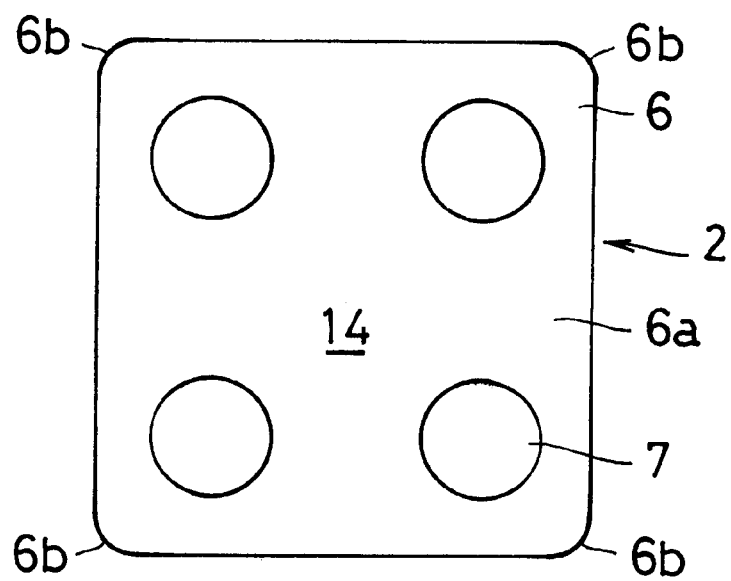
FIG. 4 is a bottom view of the mount.

As illustrated in FIGS. 3 and 4, the mount 2 comprises a plate-like main body 6 and four column-like legs 7. An inclined surface 8 is formed at the looped periphery of a first main surface 6a of the main body 6 which faces the circuit board 1. The inclined surface 8 is divergent away from the circuit board 1 to form a flaring area 13 between the circuit board 1 and the inclined surface 8 of the main body 6. In this embodiment, the inclined surface 8 is formed into arch shape with a certain radius of curvature. Four legs 7 are formed in the vicinity of four corners 6b and slightly inside the inclined surface 8 to form a cross dent 14 between the legs 7 all of which have a substantially same extension length from the first main surface 6a. Two of the corners 6b of the mount 2 shown by dotted line in FIG. 2 are connected with the circuit conductor 5. In this embodiment, a surface area of the electrode 4 is slightly larger than a plane area of the mount 2. No inclined surface is provided at the periphery of the second main surface 6c.

The first main surface 6a of the mount 2 is secured to the electrode 4 of the circuit board 1 by solder 9 as a brazing metal which is filled in the dent 14 and the flaring area 13. Since each bottom surface 7a of the legs 7 is brought into contact with the electrode 4, the mount 2 can be fixed on the electrode 4 so that the first main surface 6a of the main body 6 is kept substantially parallel to the surface of the electrode 4 due to the same extension length of the four legs 7. The solder 9 is fully filled in a gap including the flaring area 13 and dent 14 formed between the mount 2 and electrode 4 to bond the first main surface 6a of the main body 6, side walls of the legs 7, inclined surfaces 8 and the surface of the electrode 4. The solder 9 is spread all over the surface of the electrode 4 and a part of the circuit conductor 5. As the surface area of the electrode 4 is slightly larger than a plane area of the main body 6, the outer surface of the solder 9 is formed into inverted funnel shape divergent toward the electrode 4.

A diode chip 3 is attached on a second main surface 6c of the main body 6 by solder 10. In this embodiment, known reflow soldering method is utilized to apply solders 9 and 10 respectively the mount 2 and electrode 4 and between the mount 2 and diode chip 3. Specifically, subassembly is made by piling in turn on the electrode 4, adhesive solder paste, the mount 2, adhesive solder past and diode chip 3. The subassembly is transported through a heater to re-fuse the solder pastes and then the solder pastes are cooled for full setting to simultaneously bond the mount 2 and diode chip 3 on the electrode 4. Another bonding method may be applied for such subassembling.

This embodiment of the present invention can produce the following effects:

1 The legs 7 formed in the vicinity of four corners 6b of the mount 2 are in contact with electrode 4 to set the mount 2 in position to thereby prevent slant attachment of the mount the electrode 4. In addition, the main body 6 is kept away from and substantially parallel to the electrode 4 by the legs 7 with substantially uniform thickness of solder 9 between the electrode 4 and mount 2.

2 The mount 2 can firmly be bonded on the electrode 4 by solder 9 filled in the dent 14 between the legs 7 and in the flaring area 13 between the electrode 4 and the inclined surface 8 of the mount 2.

3 The outer surface of the solder 9 is formed into inverted funnel shape divergent electrode 4 whose surface area is slightly larger than a plane area of the main body 6 to provide a sufficient bonding area by the solder 9.

4 An additional bonding area is further provided by a part of the circuit conductor 5 over which solder 9 is spread.

5 A plurality of the legs 7 separated from each other provide stable attachment of the mount 2 to avoid its inclined condition of the mount 2.

6 Gas produced in solder 9 is released through the dent 14 out of solder 9 to prevent trapping of bubbles formed by evaporation of flux contained in solder paste for enhancement of bonding strength.

7 Exfoliation or detachment of the mount 2 from the electrode 4 can be avoided when the semiconductor device is used under severe variation of ambient temperature.

8 The resultant semiconductor device can effectively keep good electric properties during its long duration and improve yield in manufacture.

Figure 5:
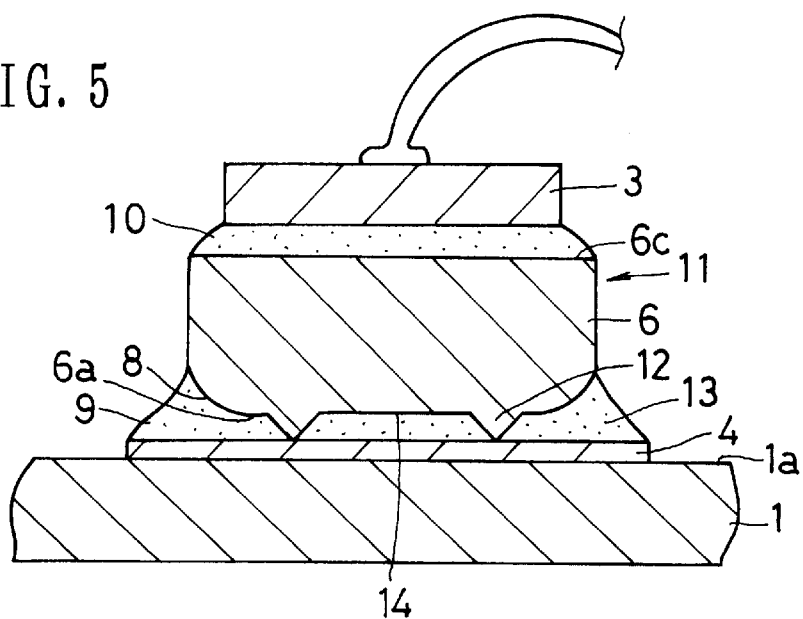
FIG. 5 is a partial section view of a second embodiment of the semiconductor device according to the present invention.
Figure 6:
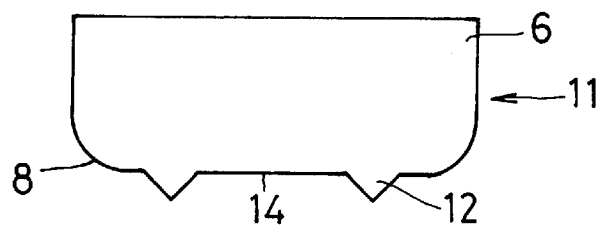
FIG. 6 is a side view of the mount used in the second embodiment shown in FIG. 5.
Figure 7:
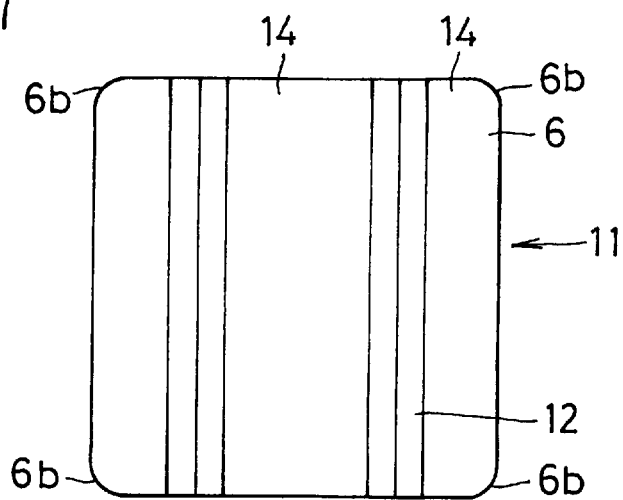
FIG. 7 is a bottom view of the mount used in the second embodiment shown in FIG. 5.

FIGS. 5 to 7 show a second embodiment of the present invention with the mount 11 which has legs 12 formed into elongated protrusions. Same reference symbols are applied to similar parts shown in FIGS. 5 to 7 to those shown in FIGS. 1 to 4. Each of these legs 12 has V-shaped section and two rows of the legs 12 are separated from each other inside two opposite side walls. It is apparent that the second embodiment provides similar effects to those of the preceding embodiment.

The foregoing embodiments of the invention may varied in view of actual demands. For instance, the legs 7 may be formed into a rectangular section although rounded section of the legs 7 is better to promote discharge of bubbles in solder 9. Also, the legs 17 may be of rectangular or U-shaped section. The main body 6 may be formed into a disk. Additional circuit conductors may be provided on the circuit board 1 for connection with the electrode 4 which may be formed in selected one of various shapes. The circuit conductor 5 may be deleted as required.

What is claimed are:

1. In a semiconductor device which includes a support; a mount secured on said support by brazing metal and a semiconductor element secured on said mount; the improvement comprising:

said mount being formed with at least an inclined surface formed at the periphery which faces said support and a plurality of legs formed inside said inclined surface to form at least a dent between said legs;

said inclined surface being divergent away from said support;

said legs being in contact with said support;

said brazing metal being disposed in a gap formed between said support and mount; said gap including said dent and a flaring area between said support and said inclined surface of said mount.

2. The semiconductor device of claim 1, wherein said mount is formed into substantially rectangular shape to form four inclined surfaces; said legs forms the dent inwardly extending from each inclined surface.

3. The semiconductor device of claim 1, wherein said legs are formed into columns separated from each other, extending from said mount.

4. The semiconductor device of claim 1, wherein said legs are formed into elongated protrusions separated from each other, extending from said mount.

5. The semiconductor device of claim 1, wherein said support includes a circuit board on which at least an electrode and circuit conductor are formed thereon for electrical connection.

* * * * *